US012710483B2

(12) United States Patent
Tanabe

(10) Patent No.: US 12,710,483 B2
(45) Date of Patent: Aug. 18, 2026

(54) GROUND FAULT DETECTION DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shinichi Tanabe, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 190 days.

(21) Appl. No.: 18/559,130

(22) PCT Filed: Apr. 22, 2022

(86) PCT No.: PCT/JP2022/018512
§ 371 (c)(1),
(2) Date: Nov. 6, 2023

(87) PCT Pub. No.: WO2022/239622
PCT Pub. Date: Nov. 17, 2022

(65) Prior Publication Data

US 2024/0230789 A1 Jul. 11, 2024

(30) Foreign Application Priority Data

May 12, 2021 (JP) ................................ 2021-080876

(51) Int. Cl.
*G01R 31/52* (2020.01)

(52) U.S. Cl.
CPC .................................. *G01R 31/52* (2020.01)

(58) Field of Classification Search
CPC ........ G01R 31/08–11; G01R 31/50–52; G01R 31/58; G01R 31/005–008; H02H 3/16–17; H02H 7/00; B60L 3/0069
See application file for complete search history.

(56) References Cited

U.S. PATENT DOCUMENTS

| | | | | |
|---|---|---|---|---|
| 2014/0049860 | A1* | 2/2014 | Arima | G01R 31/52 361/42 |
| 2015/0192630 | A1 | 7/2015 | Tsukamoto et al. | |
| 2019/0331715 | A1 | 10/2019 | Morimoto et al. | |

FOREIGN PATENT DOCUMENTS

| | | | |
|---|---|---|---|
| JP | 2012-049664 | A | 3/2012 |
| JP | 2012121403 | A * | 6/2012 |
| JP | 2018-072169 | A | 5/2018 |

OTHER PUBLICATIONS

International Search Report, Application No. PCT/JP2022/018512, mailed Jul. 19, 2022. ISA/Japan Patent Office.

* cited by examiner

*Primary Examiner* — Lee E Rodak
*Assistant Examiner* — Demetrius R Pretlow
(74) *Attorney, Agent, or Firm* — Brooks Kushman P.C.

(57) ABSTRACT

The occurrence of a ground fault can be detected more accurately. A ground fault detection device is for detecting a ground fault in a conductive path for supply of power from a first power source to a second load in an in-vehicle system. The ground fault detection device includes a voltage detection unit that detects a voltage value of the conductive path, a current detection unit that detects a current value of the conductive path, and a control unit that determines whether or not a ground fault occurred in the conductive path, based on an evaluation value that increases as the voltage value detected by the voltage detection unit decreases, and based on the current value detected by the current detection unit.

5 Claims, 7 Drawing Sheets

1
10
50
53
Control unit
Cutoff mechanism
40
21
Current detection unit
52
21
Voltage detection unit
51
20
22
Second load
12
Second power source
32
First power source
31
21
20
First load
11

● Detected current

Evaluation value (A-detected voltage) × detected current

GROUND FAULT DETECTION DEVICE

CROSS-REFERENCE TO RELATED APPLICATIONS

This application is the U.S. national stage of PCT/JP2022/018512 filed on Apr. 22, 2022, which claims priority of Japanese Patent Application No. JP 2021-080876 filed on May 12, 2021, the contents of which are incorporated herein.

TECHNICAL FIELD

The present disclosure relates to a ground fault detection device.

BACKGROUND

An overcurrent detection device disclosed in JP 2012-49664A is provided in a load drive circuit. In the load drive circuit, a semiconductor switch is provided on a conductive path that connects a DC power supply to a load, and the driving and the stopping of the load is controlled by switching the operation of the semiconductor switch between ON and OFF states. The overcurrent detection device compares the voltage across the terminals of the semiconductor switch with a determination voltage set in advance, and if the voltage across the terminals exceeds the determination voltage, the overcurrent detection device outputs an overcurrent determination signal and determines that an abnormality such as a ground fault has occurred.

With a configuration in which the voltage value of a conductive path is detected and used in abnormality determination as in the overcurrent detection device of JP 2012-49664A, when attempting to detect a ground fault in the conductive path, there is concern that a ground fault may be erroneously detected based on change that occurs in the voltage value due to the application of a surge voltage or the like. For this reason, there is a demand for a configuration for more accurately detecting the occurrence of a ground fault.

In view of this, an object of the present disclosure is to more accurately detect the occurrence of a ground fault.

SUMMARY

A ground fault detection device according to an aspect of the present disclosure is a ground fault detection device for detecting a ground fault in a conductive path for supply of power from a power source to a load in an in-vehicle system, the ground fault detection device including a voltage detection unit configured to detect a voltage value of the conductive path, a current detection unit configured to detect a current value of the conductive path, and a determination unit configured to determine whether or not a ground fault occurred in the conductive path, based on an evaluation value that increases as the voltage value detected by the voltage detection unit decreases, and based on the current value detected by the current detection unit.

Advantageous Effects

An object of the ground fault detection device according to the present disclosure is to more accurately detect the occurrence of a ground fault.

DETAILED DESCRIPTION OF PREFERRED EMBODIMENTS

Figure 1:
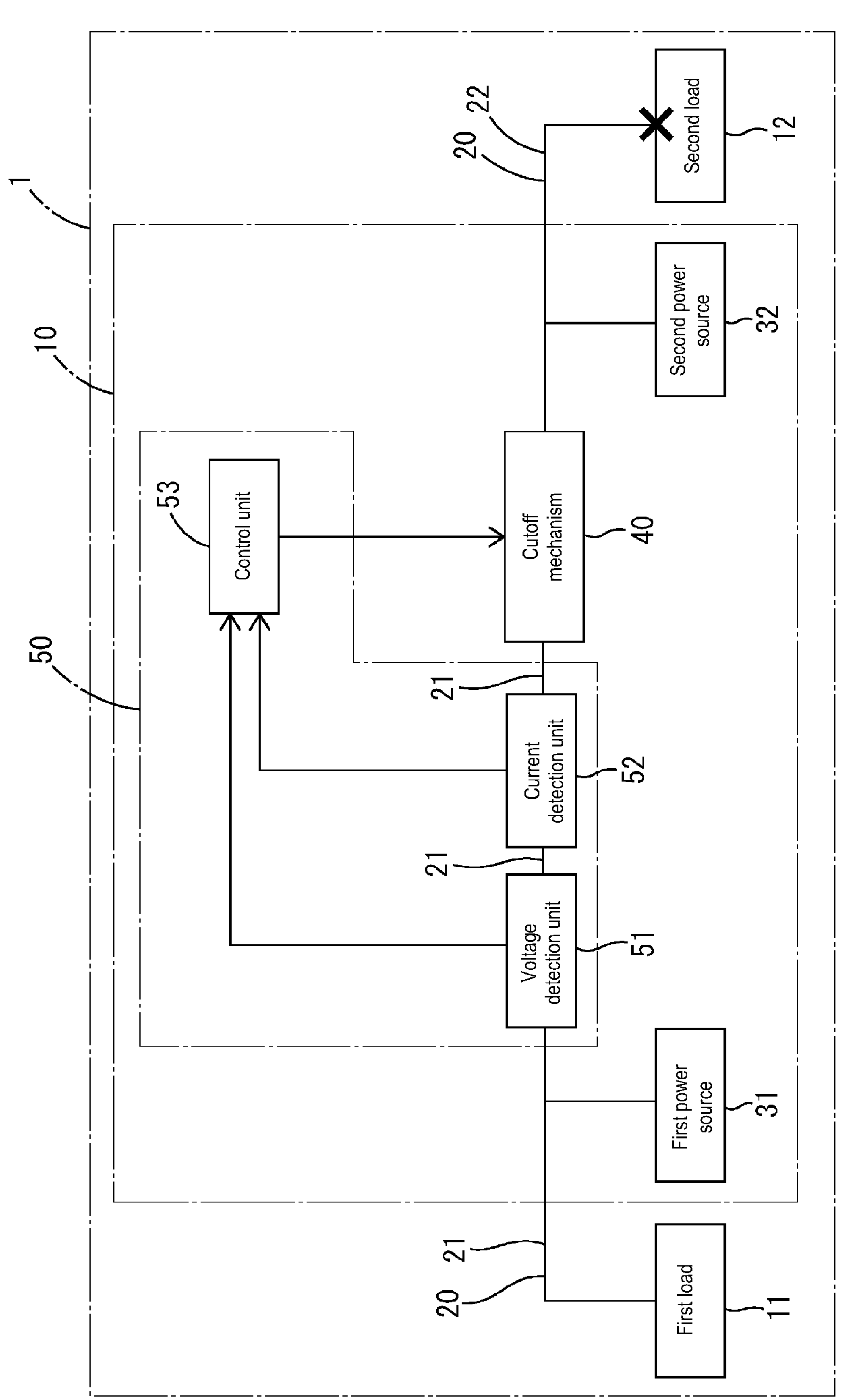
FIG. 1 is a block diagram schematically illustrating an in-vehicle system according to a first embodiment.

Embodiments of the present disclosure are listed and illustrated below. Note that the features in aspects [1] to [5] shown below may be combined in any way as long as no contradiction arises.

First Aspect

In a first aspect, a ground fault detection device for detecting a ground fault in a conductive path for supply of power from a power source to a load in an in-vehicle system, the ground fault detection device includes a voltage detection unit configured to detect a voltage value of the conductive path, a current detection unit configured to detect a current value of the conductive path, and a determination unit configured to determine whether or not a ground fault occurred in the conductive path, based on an evaluation value that increases as the voltage value detected by the voltage detection unit decreases, and based on the current value detected by the current detection unit.

In such a ground fault detection device, the evaluation value and the current value increase when a ground fault occurs in the conductive path, thus making it possible to recognize an increase in the evaluation value and the current value, and detect a ground fault in the conductive path. If a surge voltage is applied to the conductive path, the evaluation value changes, but the current value is less likely to change, thus making it possible to suppress the case where the occurrence of a ground fault is erroneously detected based on a surge voltage. If an inrush current flows in the conductive path, the current value increases, but the evaluation value is less likely to change, thus making it possible to suppress the case where the occurrence of a ground fault is erroneously detected based on an inrush current. Therefore, the ground fault detection device can more accurately detect the occurrence of a ground fault in the conductive path.

Second Aspect

In a second aspect, the ground fault detection device according to a first aspect may have a configuration in which the evaluation value is based on a subtraction result value obtained by subtracting the voltage value from a predetermined setting value.

In the ground fault detection device according to the second aspect, the evaluation value reflects the difference of the voltage value from the predetermined setting value, thus making it possible to realize an evaluation value determination method according to which the evaluation value increases as the voltage value decreases.

Third Aspect

In a third aspect, the ground fault detection device according to a second aspect may have a configuration in which the in-vehicle system includes a first conductive path to which the power source is electrically connected, a second conductive path to which the load is electrically connected, a cutoff portion provided between the first conductive path and the second conductive path and configured to cut off conduction of power from the first conductive path to the second conductive path, and a Zener diode connected in parallel with the cutoff portion, having an anode electrically connected to the second conductive path, and having a cathode electrically connected to the first conductive path. Also, the voltage detection unit may detect the voltage value of the first conductive path. Furthermore, the setting value may be greater than a breakdown voltage of the Zener diode.

In the ground fault detection device according to the third aspect, in the case where a ground fault occurs in the second conductive path, even if a surge voltage or the like is generated in the first conductive path and the voltage value becomes large enough to cause breakdown of the Zener diode, the subtraction result value obtained by subtracting the voltage value from the setting value does not become negative, and the behavior of the voltage value can be recognized more easily.

Fourth Aspect

In a fourth aspect, the ground fault detection device according to any of the first through the third aspects may have a configuration in which in a case where a product of the evaluation value and the current value detected by the current detection unit reached a threshold value, or a corrected value obtained by correcting the product reached the threshold value, the determination unit determines that a ground fault occurred in the conductive path.

In the ground fault detection device according to the fourth aspect, by using the product of the evaluation value and the current value, which both increase when a ground fault occurs, or using a corrected value obtained by correcting the product, the ground fault determination can be made using a value that undergoes a larger extent of change. Therefore, the ground fault detection device can even more accurately detect the occurrence of a ground fault in the conductive path.

Fifth Aspect

In a fifth aspect, the ground fault detection device according to the fourth aspect may have a configuration in which the evaluation value is based on a subtraction result value obtained by subtracting the voltage value detected by the voltage detection unit from a predetermined setting value. Also, in a case where the product of the evaluation value and the current value detected by the current detection unit reached the threshold value, the determination unit may determine that a ground fault occurred in the conductive path.

The ground fault detection device according to fifth aspect can use a simple calculation formula to determine the evaluation value that increases as the voltage value decreases, and can then make the ground fault determination using the product of the evaluation value and the current value, which both increase when a ground fault occurs, that is to say using a value that undergoes a larger extent of change.

First Embodiment

An in-vehicle system 1 shown in FIG. 1 is for installation in a vehicle such as a hybrid automobile, for example. The in-vehicle system 1 includes an in-vehicle power supply device 10, a first load 11, a second load 12, and a conductive path 20. The in-vehicle power supply device 10 is configured to supply power to the first load 11 and the second load 12 via the conductive path 20. The conductive path 20 is a path for supplying power from a first power source 31 and a second power source 32, which will be described later, to the first load 11 and the second load 12.

The first load 11 and the second load 12 are electric loads that operate upon receiving a supply of power from the first power source 31 and the second power source 32, which will be described later. Examples of the first load 11 and the second load 12 include a motor, an electric power steering system, and a shift-by-wire system. The first load 11 and the second load 12 are electrically connected to the conductive path 20.

In the present disclosure, the term "electrically connected" desirably means a configuration in which connection targets are connected to each other in a conductive state (a state in which current can flow) according to which the potentials of the connection targets are equal to each other. However, the present disclosure is not limited to this configuration. For example, the term "electrically connected" may mean a configuration in which two connection targets are connected in a state in which electricity can flow therebetween via an electric component interposed between the connection targets.

The conductive path 20 has a first conductive path 21 and a second conductive path 22. The first conductive path 21 and the second conductive path 22 are electrically connected to each other. The first power source 31 and the first load 11 are electrically connected to the first conductive path 21. The second power source 32 and the second load 12 are electrically connected to the second conductive path 22.

The in-vehicle power supply device 10 includes the first power source 31, the second power source 32, a cutoff mechanism 40, and a ground fault detection device 50. The first power source 31 and the second power source 32 are each constituted by a power source such as a lithium ion battery or an electric double layer capacitor, for example.

The cutoff mechanism 40 is provided at a midpoint in the conductive path 20. The cutoff mechanism 40 is provided between the first conductive path 21 and the second conductive path 22. The cutoff mechanism 40 has a function of switching the state of conduction between the first power source 31 and the second power source 32 to a conductive state or a non-conductive state based on a control signal from a control unit 53, which will be described later.

Figure 2:
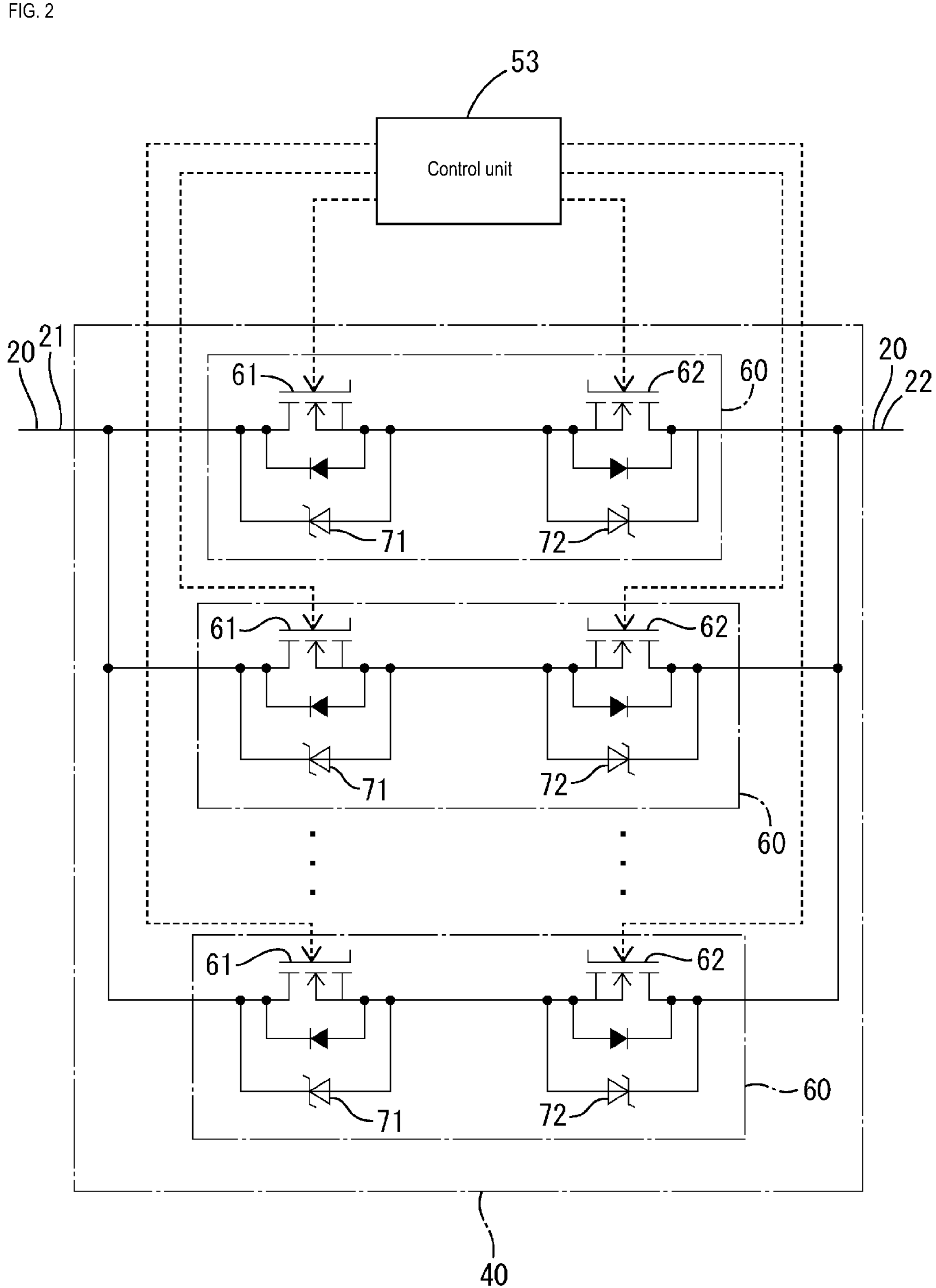
FIG. 2 is a circuit diagram schematically illustrating a configuration of a cutoff mechanism in FIG. 1.

As shown in FIG. 2, the cutoff mechanism 40 includes a plurality of cutoff units 60, a plurality of first Zener diodes 71, and a plurality of second Zener diodes 72. Note that there is no limitation on the number of cutoff units 60, and any number of them may be provided. The cutoff units 60 are connected in parallel. Each of the cutoff units 60 includes a first cutoff portion 61 and a second cutoff portion 62. The first cutoff portion 61 and the second cutoff portion 62 are each configured as an N-channel MOSFET, for example. The first cutoff portion 61 and the second cutoff portion 62 have a function of cutting off the conductive path 20. The first cutoff portion 61 cuts off the conduction of power from the first conductive path 21 to the second conductive path 22. The drain of the first cutoff portion 61 is electrically connected to the first conductive path 21. The source of the first cutoff portion 61 is electrically connected to the source of the second cutoff portion 62. The second cutoff portion 62 cuts off the conduction of power from the second conductive path 22 to the first conductive path 21. The drain of the second cutoff portion 62 is electrically connected to the second conductive path 22. A control signal (ON signal or OFF signal) from the later-described control unit 53 is input to the gate of the first cutoff portion 61 and the gate of the second cutoff portion 62.

The first Zener diode 71 and the second Zener diode 72 correspond to an example of the "Zener diode" of the present disclosure. The first Zener diode 71 is connected in parallel with the first cutoff portion 61. The anode of the first Zener diode 71 is electrically connected to the second conductive path 22 via the second cutoff portion 62 and the second Zener diode 72. Specifically, the anode of the first Zener diode 71 is electrically connected to the source of the first cutoff portion 61 and the source of the second cutoff portion 62. The cathode of the first Zener diode 71 is electrically connected to the first conductive path 21 and the drain of the first cutoff portion 61. The second Zener diode 72 is connected in parallel with the second cutoff portion 62. The anode of the second Zener diode 72 is electrically connected to the first conductive path 21 via the first cutoff portion 61 and the first Zener diode 71. Specifically, the anode of the second Zener diode 72 is electrically connected to the source of the first cutoff portion 61 and the source of the second cutoff portion 62. The cathode of the second Zener diode 72 is electrically connected to the second conductive path 22 and the drain of the second cutoff portion 62. For example, the first Zener diode 71 and the second Zener diode 72 have the same configuration, and the breakdown voltage of the first Zener diode 71 and the breakdown voltage of the second Zener diode 72 are the same.

The ground fault detection device 50 has a function of detecting a ground fault in the conductive path 20. The ground fault detection device 50 includes a voltage detection unit 51, a current detection unit 52, and a control unit 53.

The voltage detection unit 51 is configured as a known voltage detection circuit, for example. The voltage detection unit 51 detects the voltage of the first conductive path 21 and outputs a signal corresponding to the voltage of the first conductive path 21. The signal corresponding to the voltage of the first conductive path 21 is input to the control unit 53.

The current detection unit 52 is provided at a midpoint in the first conductive path 21. The current detection unit 52 includes a resistor and a differential amplifier, and is configured to detect a value indicating the current flowing through the first conductive path 21 (specifically, an analog voltage corresponding to the value of the current flowing through the first conductive path 21), and output the detected value as the current value, for example. The current value output from the current detection unit 52 can be input to the control unit 53, for example.

The control unit 53 corresponds to an example of the "determination unit" of the present disclosure. The control unit 53 is configured as an information processing device having a computation function and an information processing function, for example. The control unit 53 may be configured as a microcomputer, or may be configured as another type of information processing device. The control unit 53 determines whether or not a ground fault has occurred in the conductive path 20 (e.g., the second load 12) based on the voltage value detected by the voltage detection unit 51 (hereinafter also referred to as the detected voltage) and the current value detected by the current detection unit 52 (hereinafter also referred to as the detected current). Specifically, the control unit 53 determines whether or not a ground fault has occurred in the conductive path 20 (e.g., the second load 12) based on an evaluation value and the detected current.

The evaluation value is determined by a determination method according to which the evaluation value increases as the detected voltage decreases. The evaluation value is a value that is based on a predetermined setting value and the detected voltage, for example. The setting value is a fixed value set in advance in the control unit 53 when designing the circuit of the in-vehicle system 1, for example. A configuration is also possible in which, for example, a variable is set in the control unit 53, and the setting value is determined using a predetermined calculation formula or table (a table in which setting values are associated with other variables) each time a predetermined timing (such as when the ignition switch is turned on) is reached.

The evaluation value is a value that is based on a subtraction result value obtained by subtracting the detected voltage from the setting value, for example. For example, the evaluation value is represented by A-V, where A is the setting value and V is the detected voltage. Accordingly, the evaluation value reflects the difference between a reference value (setting value) and the detected voltage, thus making it possible to realize an evaluation value determination method according to which the evaluation value increases as the detected voltage decreases. A setting value A is a value greater than the output voltage of the first power source 31 and the output voltage of the second power source 32. Accordingly, if a ground fault occurs in the conductive path 20, the evaluation value remains a positive value and increases. The setting value A is a value greater than the breakdown voltages of the Zener diodes 71 and 72. In the case where a ground fault occurs in the second conductive path 22, even if a surge voltage or the like is generated in the conductive path 20 and the detected voltage becomes large enough to cause breakdown of the Zener diode 71 or 72, the subtraction result value obtained by subtracting the detected voltage from the setting value does not become negative, and the behavior of the detected voltage can be recognized more easily.

The control unit 53 compares the product of the evaluation value and the detected current with a threshold value. The threshold value is set higher than the power (the product of the detected voltage and the detected current) at the time when an inrush current flows in the conductive path 20, for example. For example, the threshold value is a value 1.5 times the power (the product of the detected voltage and the detected current) at the time when an inrush current flows in the conductive path 20. If the product of the evaluation value and the detected current reaches the threshold value, the control unit 53 determines that a ground fault has occurred in the conductive path 20.

For example, consider the case where power is supplied from the first power source 31 to the first load 11 and the second load 12. If a ground fault occurs in the conductive path 20, both the evaluation value and the detected current increase. For this reason, the control unit 53 can recognize an increase in the evaluation value and the current value, and detect the ground fault in the conductive path 20. In particular, by using the product of the evaluation value and the current value, which both increase when a ground fault occurs, the ground fault determination can be made using a value that undergoes a larger extent of change. If a surge voltage is applied to the conductive path 20, the evaluation value changes due to change in the detected voltage, but the detected current is less likely to change (the value of the product of the evaluation value and the detected current is smaller than at the time when a ground fault occurs), thus making it possible to suppress the case where the application of a surge voltage is erroneously detected as the occurrence of a ground fault. Also, when an inrush current flows in the conductive path 20, the detected current increases, but the evaluation value is less likely to change, thus making it possible to suppress the case where the flow of an inrush current is erroneously detected as the occurrence of a ground fault. Therefore, the ground fault detection device 50 can more accurately detect the occurrence of a ground fault in the conductive path 20.

Upon determining that a ground fault has occurred in the conductive path 20, the control unit 53 outputs a control signal (OFF signal) to the cutoff mechanism 40 (the gate of the first cutoff portion 61 and the gate of the second cutoff portion 62). Based on the control signal (OFF signal) from the control unit 53, the cutoff mechanism 40 switches the state of conduction between the first power source 31 and the second power source 32 from the conductive state to the non-conductive state. Accordingly, the power system of the vehicle (e.g., the power system on the first conductive path 21 side) is separated from the ground fault location (e.g., the second load 12), and a voltage drop in the power system is suppressed, thus making it possible to achieve voltage stabilization.

Figure 3:
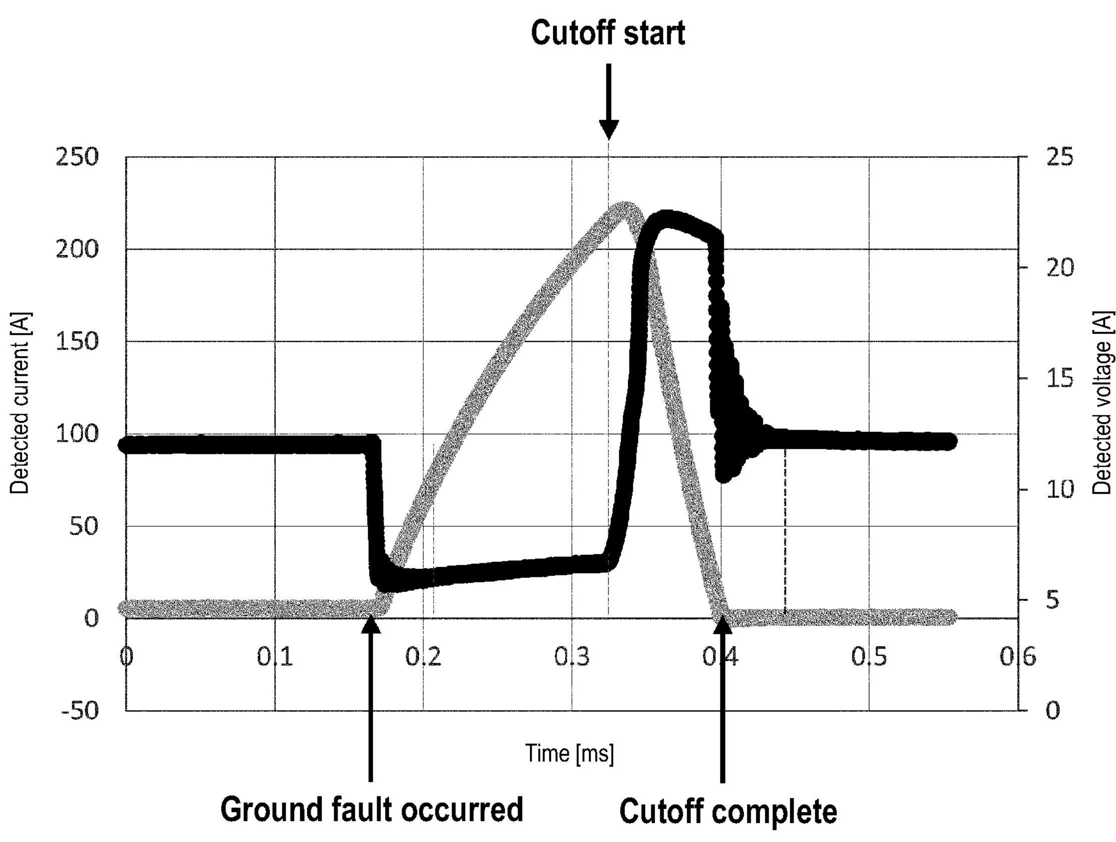
FIG. 3 is an illustrative diagram showing an example of change over time in a current value detected by a current detection unit in FIG. 1 and change over time in a voltage value detected by a voltage detection unit.

FIG. 3 is an illustrative diagram showing an example of change over time in the detected current and change over time in the detected voltage in the in-vehicle system 1 in FIG. 1. Below, consider the case where power is supplied from the first power source 31 to the first load 11 and the second load 12. As shown in FIG. 3, when a ground fault occurs in the conductive path 20 (e.g., the second load 12), the detected voltage drops sharply, and the detected current starts to increase. When the ground fault detection device 50 detects a ground fault and the cutoff mechanism 40 starts performing cutoff control on the conductive path 20, the detected current starts to drop from the normal operating voltage (the output voltage of the first power source 31), and a surge voltage flows in the conductive path 20. For example, when a surge voltage flows, a Zener diode (e.g., first Zener diode 71) breaks down, and the detected voltage is clamped at the breakdown voltage. After the cutoff control performed on the conductive path 20 by the cutoff mechanism 40 is complete, both the detected voltage and the detected current are in the same state as before the occurrence of the ground fault.

Figure 4:
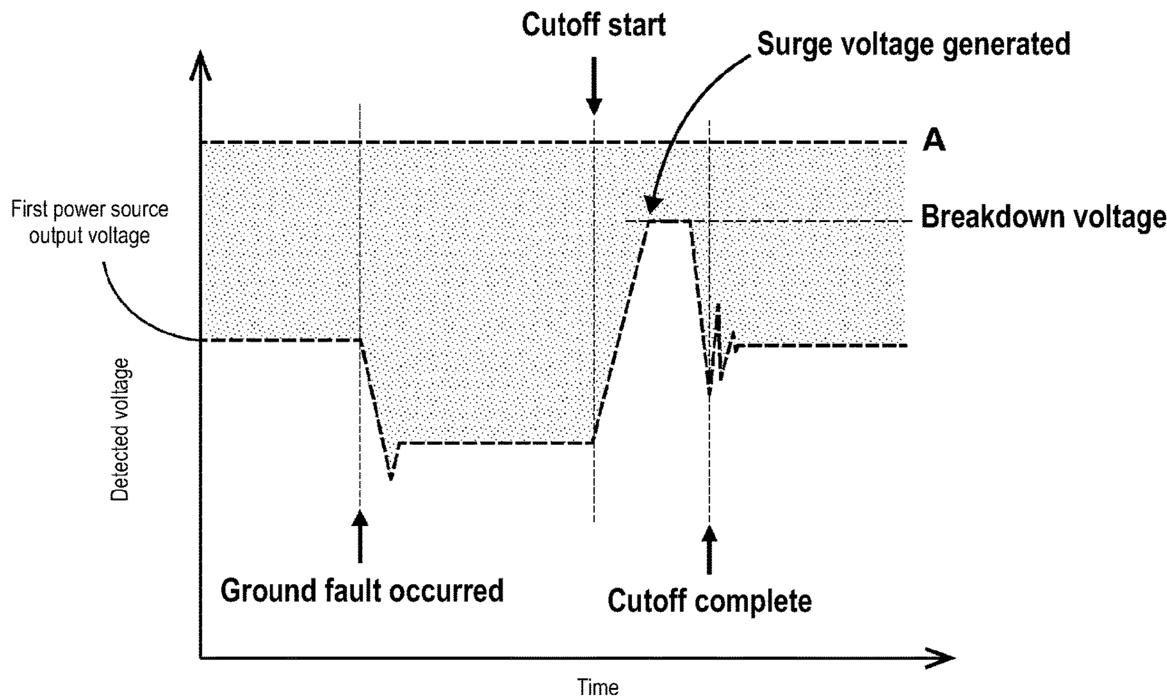
FIG. 4 is an illustrative diagram schematically showing an example of change over time in a detected voltage when a ground fault occurs in a conductive path in the in-vehicle system in FIG. 1.

FIG. 4 is an illustrative diagram schematically showing an example of change over time in the evaluation value detected by the in-vehicle system 1 in FIG. 1. The evaluation value (A-V) is represented by the hatched area shown in FIG. 4. The setting value A is a value greater than the output voltage of the first power source 31. Accordingly, when a ground fault occurs in the conductive path 20 (e.g., the second load 12), the evaluation value remains a positive value and increases. After the start of cutoff control performed by the cutoff mechanism 40, a surge voltage flows and a Zener diode (e.g., the first Zener diode 71) breaks down, but since the setting value A is a value greater than the breakdown voltages of the Zener diodes 71 and 72, the evaluation value (A-V) does not become a negative value.

Figure 5:
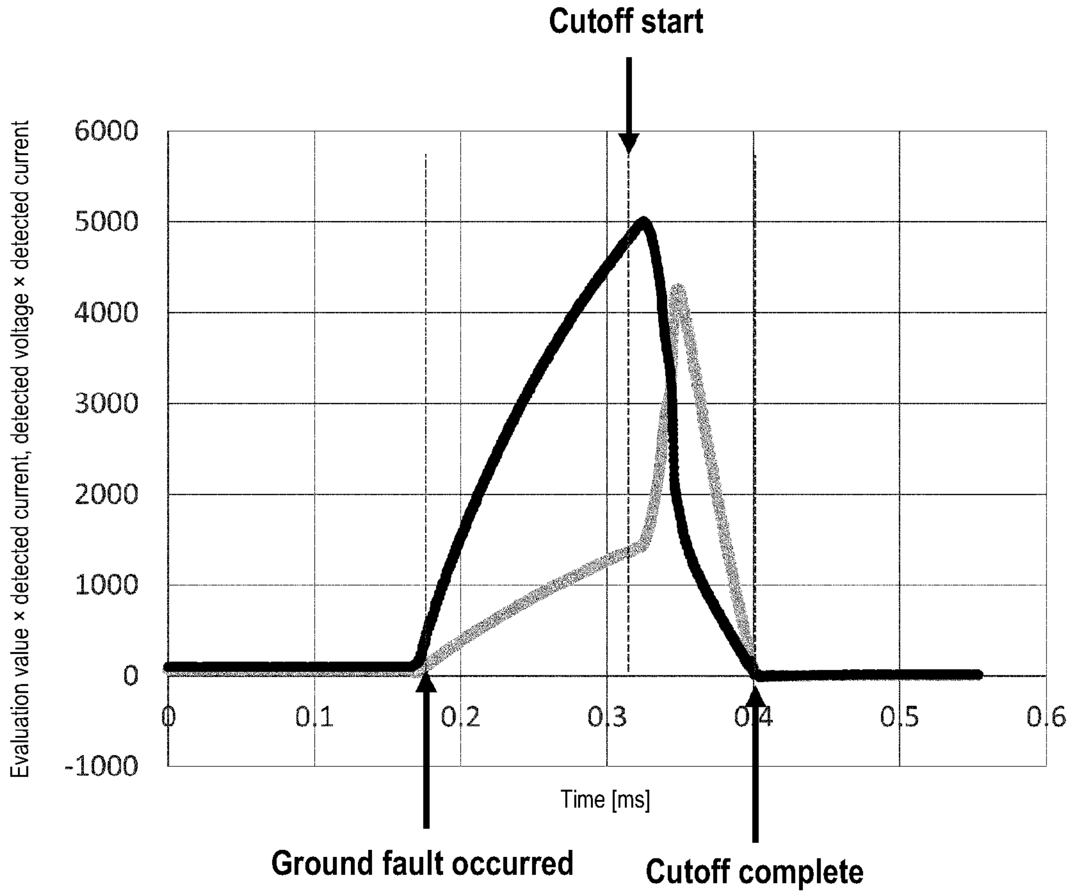
FIG. 5 is an illustrative diagram schematically showing an example of change over time in the product of an evaluation value and a detected current and change over time in a power value when a ground fault occurs in the conductive path in the in-vehicle system in FIG. 1.

FIG. 5 is an illustrative diagram showing an example of change over time in the product of the detected voltage and the detected current (i.e., change over time in the power value) detected by the in-vehicle system 1 in FIG. 1, and change over time in the product of the evaluation value and the current value. As shown in FIG. 5, after a ground fault occurs in the conductive path 20, the product of the evaluation value and the current value increases at a faster rate than the product of the detected voltage and the detected current. For this reason, the ground fault detection device 50 can make a ground fault determination using a value that undergoes a larger extent of change over time (the product of the evaluation value and the current value).

As shown in FIG. 5, when the cutoff mechanism 40 starts performing cutoff control on the conductive path 20, the product of the detected voltage and the detected current rapidly increases due to the flow of the surge voltage. On the other hand, the product of the evaluation value and the current value drops rapidly after the cutoff mechanism 40 starts performing cutoff control on the conductive path 20. For this reason, by using the product of the evaluation value and the current value to make the ground fault determination, the ground fault detection device 50 does not detect a rapid increase in power that is based on a surge voltage after the start of cutoff control, and it is possible to suppress the case where the occurrence of a ground fault is erroneously detected based on the surge voltage.

Figure 6:
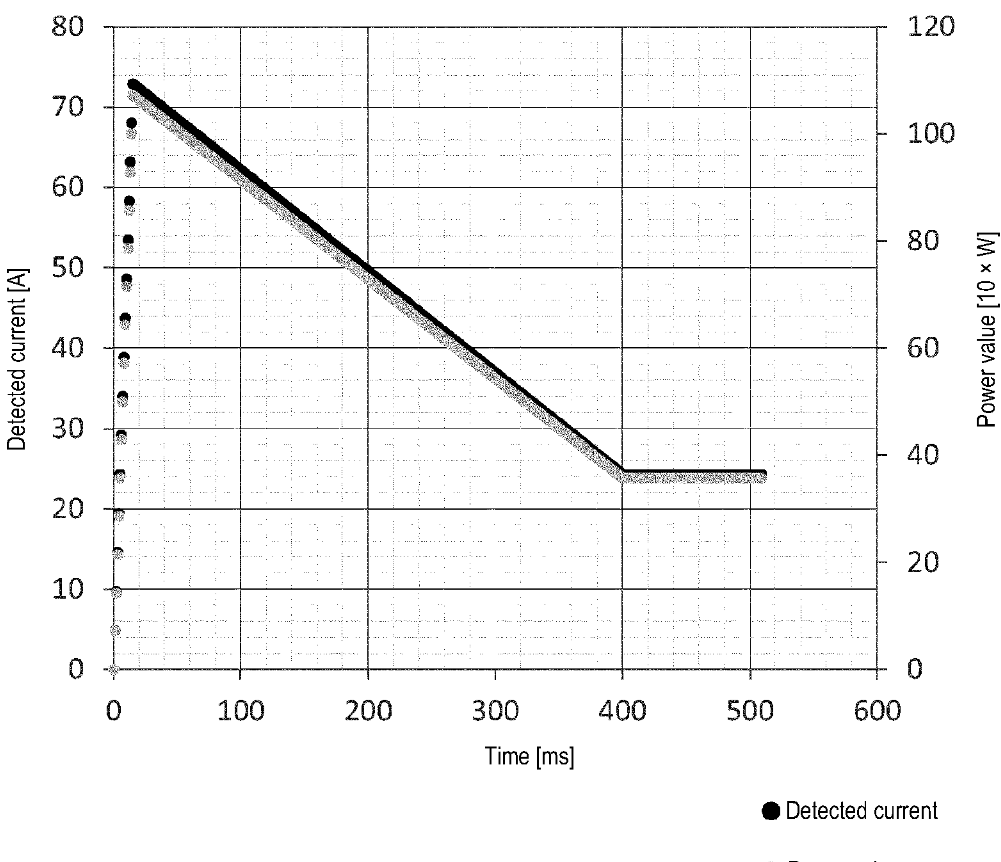
FIG. 6 is an illustrative diagram showing an example of change over time in a detected current and change over time in a power value when an inrush voltage flows in the in-vehicle system in FIG. 1.

FIG. 6 is an illustrative diagram showing an example of change over time in the detected current and change over time in the power value (the product of the detected voltage and the detected current) when an inrush voltage flows in the conductive path 20 in the in-vehicle system 1 in FIG. 1. As shown in FIG. 6, when an inrush current flows, the maximum detected current (also referred to as the inrush current value) detected by the current detection unit 52 is 72 A. When the inrush current flows, the detected maximum power value is 1050 W. Here, a value (108 A) that is about 1.5 times the inrush current value, for example, is used as the threshold current used to determine whether a ground fault has occurred in the conductive path 20. A value (1580 W) that is approximately 1.5 times the maximum power value when an inrush current flows, for example, is used as the threshold power used to determine whether a ground fault has occurred in the conductive path 20.

Figure 7:
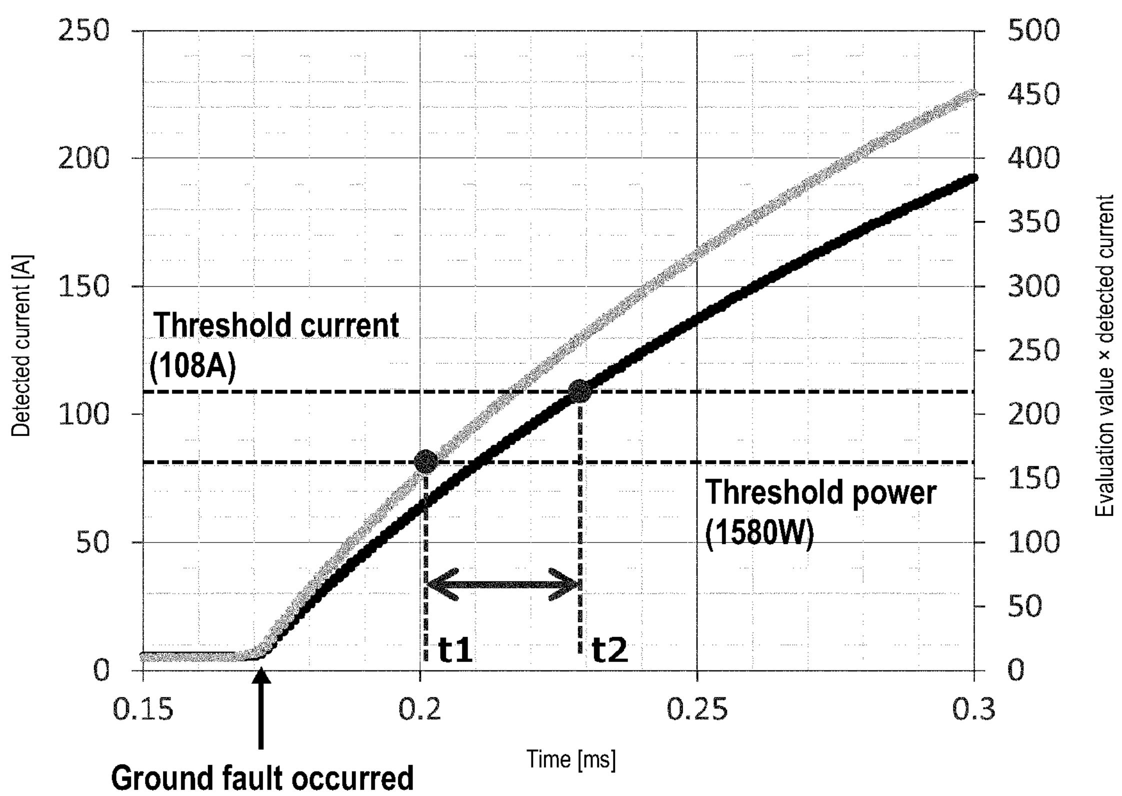
FIG. 7 is an illustrative diagram showing an example of change over time in the product of an evaluation value and a detected current and change over time in a detected current when a ground fault occurs in the in-vehicle system in FIG. 1.

FIG. 7 is an illustrative diagram showing an example of change over time in the detected current and change over time in the product of the evaluation value and the detected current when a ground fault occurs in the conductive path 20 in the in-vehicle system 1 in FIG. 1. As shown in FIG. 7, the product of the evaluation value and the detected current increases over time and reaches the threshold power (1580 W) at a time t1. Note that the setting value included in the evaluation value is 30. The detected current increases over time and reaches the threshold current (108 A) at a time t2. The time t1 at which the product of the evaluation value and the detected current reaches the threshold power is about 30 us earlier than the time t2 at which the detected current reaches the threshold current. This is because by using the product of the evaluation value and the current value, which both increase when a ground fault occurs, the ground fault determination can be made using a numerical value that undergoes a larger extent of change.

Next, effects of the configuration according to the present disclosure will be described.

In the ground fault detection device 50 of the present disclosure, the control unit 53 determines whether or not a ground fault has occurred in the conductive path 20 based on the evaluation value, which increases as the voltage value detected by the voltage detection unit 51 decreases, and based on the current value detected by the current detection unit 52. Accordingly, since the evaluation value and the current value increase when a ground fault occurs in the conductive path 20, it is possible to recognize an increase in the evaluation value and the current value, and detect a ground fault in the conductive path 20. If a surge voltage is applied to the conductive path 20, the evaluation value changes, but the current value is less likely to change, thus making it possible to suppress the case where the occurrence of a ground fault is erroneously detected based on a surge voltage. If an inrush current flows in the conductive path 20, the current value increases, but the evaluation value is less likely to change, thus making it possible to suppress the case where the occurrence of a ground fault is erroneously detected based on an inrush current. Therefore, the ground fault detection device 50 can more accurately detect the occurrence of a ground fault in the conductive path 20.

In the ground fault detection device 50 of the present disclosure, the evaluation value is a value that is based on a subtraction result value obtained by subtracting the voltage value detected by the voltage detection unit 51 from a predetermined setting value. Accordingly, with the ground fault detection device 50, the evaluation value reflects the difference of the voltage value from the setting value, thus making it possible to realize an evaluation value determination method according to which the evaluation value increases as the voltage value decreases. The ground fault detection device 50 of the present disclosure includes the first Zener diode 71 that is connected in parallel with the first cutoff portion 61, and whose anode is electrically connected to the second conductive path 22 and whose cathode is electrically connected to the first conductive path 21. The setting value is greater than the breakdown voltage of the first Zener diode 71. Accordingly, in the ground fault detection device 50, in the case where a ground fault occurs in the second conductive path 22, even if a surge voltage or the like is generated in the first conductive path 21 and the voltage value becomes large enough to cause breakdown of the first Zener diode 71, the subtraction result value obtained by subtracting the voltage value from the setting value does not become negative, and the behavior of the voltage value can be recognized more easily.

In the ground fault detection device 50 of the present disclosure, if the product of the evaluation value and the current value detected by the current detection unit 52 reaches a threshold value, the control unit 53 determines that a ground fault has occurred in the conductive path 20. Accordingly, by using the product of the evaluation value and the current value, which both increase when a ground fault occurs, the ground fault detection device 50 can make the ground fault determination using a value that undergoes a larger extent of change. Therefore, the ground fault detection device 50 can even more accurately detect the occurrence of a ground fault in the conductive path 20.

In the ground fault detection device 50 of the present disclosure, the evaluation value is a value that is based on a subtraction result value obtained by subtracting the detected voltage from the setting value. If the product of the evaluation value and the detected current reaches a threshold value, the control unit 53 determines that a ground fault has occurred in the conductive path 20. Accordingly, the ground fault detection device 50 can use a simple calculation formula to determine the evaluation value that increases as the voltage value decreases, and can then make the ground fault determination using the product of the evaluation value and the current value, which both increase when a ground fault occurs, that is to say using a value that undergoes a larger extent of change.

OTHER EMBODIMENTS

The present disclosure is not limited to the embodiments illustrated by the above description and drawings. For example, the features of the embodiments described above and below can be combined as long as no contradiction arises. Also, any feature of the embodiments described above and below may be omitted if not explicitly indicated as being essential. Furthermore, the embodiments described above may be modified as follows.

In the first embodiment, the subtraction result value obtained by subtracting the detected voltage from the setting value is illustrated as an example of the evaluation value, but other configurations may be used as long as the evaluation value is a value that increases as the detected voltage decreases. For example, the evaluation value may be the reciprocal value of the detected voltage.

In the first embodiment, an example is described in which the setting value A included in the evaluation value used for ground fault determination is a fixed value or a variable, but the setting value A may be another value. For example, the setting value A may be configured such that a fixed value is corrected each time a predetermined timing (such as when an ignition switch is turned on) is reached. For example, the setting value A may be a value determined based on the temperature (the temperature of the conductive path 20 or the like).

In the first embodiment, the evaluation value is a subtraction result value obtained by subtracting the detected voltage from the setting value, but the evaluation value may be another value that is based on the setting value and the detected voltage. For example, the evaluation value may be the absolute value of the difference between the setting value and the detected voltage. In this case, the setting value is set to a value greater than the output voltage of the power sources (the first power source 31 and the second power source 32), and thus the evaluation value is a positive value that increases when a ground fault occurs in the conductive path 20. As another example, the evaluation value may be a value that is based on the setting value and a value obtained by multiplying the detected voltage by a predetermined value (such as a constant value). Also, the evaluation value may be a subtraction result value obtained by subtracting the detected voltage from the setting value, or a value obtained by multiplying the absolute value of the difference between the setting value and the detected voltage by a predetermined value (such as a constant value).

In the first embodiment, the product of the evaluation value and the detected current is used to make the ground fault determination, but another value may be used as long as the occurrence of a ground fault is determined based on the evaluation value and the detected current. For example, the occurrence of a ground fault may be determined based on the sum of the evaluation value and the detected current.

In the first embodiment, the product of the evaluation value and the detected current is compared with the threshold value when making the ground fault determination, but a configuration is possible in which a corrected value is obtained by correcting the product of the evaluation value and the detected current (adding a predetermined value to the product or subtracting a predetermined value from the product), and the corrected value is compared with the threshold value.

In the first embodiment, in the ground fault determination, it is determined that a ground fault has occurred in the conductive path 20 if the product of the evaluation value and the detected current reaches the threshold value, but it may be determined that a ground fault has occurred in the conductive path 20 if a rate of increase in the product of the evaluation value and the detected current reaches a predetermined value.

In the first embodiment, an example is described in which the occurrence of a ground fault in the second conductive path 22 (e.g., the second load) is detected based on the voltage value and the current value detected in the first conductive path 21, but the occurrence of a ground fault in the first conductive path 21 (e.g., the first load) may be detected based on the voltage value and the current value detected in the second conductive path 22 (a configuration in which the voltage detection unit and the current detection unit are provided in the second conductive path 22).

It should be noted that the embodiments disclosed herein should be considered as examples in all respects and not restrictive. The scope of the present disclosure is not limited to the embodiments disclosed herein, and is intended to include all modifications within the scope indicated by the claims or within a scope equivalent to the claims.

The invention claimed is:

1. A ground fault detection device for detecting a ground fault in a conductive path for supply of power from a power source to a load in an in-vehicle system, the ground fault detection device comprising:
- a voltage detection unit configured to detect a voltage value of the conductive path;
- a current detection unit configured to detect a current value of the conductive path; and
- a determination unit configured to determine whether or not a ground fault occurred in the conductive path based on both an evaluation value and the current value detected by the current detection unit, wherein the evaluation value increases as the voltage value detected by the voltage detection unit decreases, and wherein the evaluation value is based on a subtraction result value obtained by subtracting the voltage value from a predetermined setting value.

2. The ground fault detection device according to claim 1, wherein the in-vehicle system includes:
- a first conductive path to which the power source is electrically connected;
- a second conductive path to which the load is electrically connected;
- a cutoff portion provided between the first conductive path and the second conductive path and configured to cut off conduction of power from the first conductive path to the second conductive path; and
- a Zener diode connected in parallel with the cutoff portion, having an anode electrically connected to the second conductive path, and having a cathode electrically connected to the first conductive path, the voltage detection unit detects the voltage value of the first conductive path, and the setting value is greater than a breakdown voltage of the Zener diode.

3. The ground fault detection device according to claim 1, wherein in a case where a product of the evaluation value and the current value detected by the current detection unit reached a threshold value, or a corrected value obtained by correcting the product reached the threshold value, the determination unit determines that a ground fault occurred in the conductive path.

4. The ground fault detection device according to claim 3, wherein in a case where the product of the evaluation value and the current value detected by the current detection unit reached the threshold value, the determination unit determines that a ground fault occurred in the conductive path.

5. The ground fault detection device according to claim 2, wherein in a case where a product of the evaluation value and the current value detected by the current detection unit reached a threshold value, or a corrected value obtained by correcting the product reached the threshold value, the determination unit determines that a ground fault occurred in the conductive path.

* * * * *